(12) United States Patent
Zou et al.

(10) Patent No.: US 12,317,201 B2
(45) Date of Patent: May 27, 2025

(54) SIGNAL BLOCK RECEPTION WITH AUTOMATIC GAIN CONTROL ADJUSTMENT

(71) Applicant: Telefonaktiebolaget LM Ericsson (publ), Stockholm (SE)

(72) Inventors: Gang Zou, Lund (SE); Henrik Sjöland, Lund (SE); Sina Maleki, Malmö (SE); Andres Reial, Höllviken (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 89 days.

(21) Appl. No.: 17/776,450

(22) PCT Filed: Nov. 18, 2019

(86) PCT No.: PCT/EP2019/081670
§ 371 (c)(1),
(2) Date: May 12, 2022

(87) PCT Pub. No.: WO2021/098946
PCT Pub. Date: May 27, 2021

(65) Prior Publication Data
US 2024/0163813 A1 May 16, 2024

(51) Int. Cl.
*H04W 52/52* (2009.01)
*H04W 52/24* (2009.01)
*H04W 52/36* (2009.01)

(52) U.S. Cl.
CPC ......... *H04W 52/52* (2013.01); *H04W 52/241* (2013.01); *H04W 52/365* (2013.01)

(58) Field of Classification Search
CPC . H04W 52/52; H04W 52/241; H04W 52/365; H04L 5/0048; H04L 27/3809; H03G 3/3078
See application file for complete search history.

(56) References Cited

U.S. PATENT DOCUMENTS

| 8,457,260 B2 | 6/2013 | Khandekar et al. |
| 9,989,622 B1 * | 6/2018 | Griesdorf .............. G01S 13/878 |

(Continued)

FOREIGN PATENT DOCUMENTS

| WO | 2021004600 A1 | 1/2021 |
| WO | 2021032270 A1 | 2/2021 |

OTHER PUBLICATIONS

"3GPP TS 38.211 V15.7.0", 3rd Generation Partnership Project; Technical Specification Group Radio Access Network; NR; Physical channels and modulation (Release 15), Sep. 2019, pp. 1-97.

(Continued)

*Primary Examiner* — Lan-Huong Truong
(74) *Attorney, Agent, or Firm* — Murphy, Bilak & Homiller, PLLC

(57) ABSTRACT

A method of signal block reception with automatic gain control (AGC) for a receiver is disclosed. The receiver is configured for at least a sleep mode and an active mode. The signal blocks are non-adjacent in time, and each signal block is configured to be received in entirety using a valid AGC setting determined based on a previous signal block. The method comprises, when switching from the sleep mode to the active mode for continuous reception of a signal block, receiving a first set of samples of the signal block, determining an applicable AGC setting based on the first set of samples of the signal block, and receiving a second set of samples of the signal block using the applicable AGC setting determined based on the first set of samples. Corresponding apparatus, receiver, wireless communication device and computer program product are also disclosed.

18 Claims, 2 Drawing Sheets

(56) References Cited

U.S. PATENT DOCUMENTS

| | | | |
|---|---|---|---|
| 2008/0130770 A1* | 6/2008 | Khandekar | H04L 27/3809 |
| | | | 375/260 |
| 2010/0184397 A1 | 7/2010 | Kadous et al. | |
| 2010/0310096 A1* | 12/2010 | Josefsson | H04R 3/06 |
| | | | 381/113 |
| 2013/0301428 A1 | 11/2013 | Weng et al. | |
| 2015/0103937 A1* | 4/2015 | Cudak | H04B 7/0695 |
| | | | 375/267 |
| 2019/0261444 A1 | 8/2019 | Axmon et al. | |
| 2022/0182951 A1* | 6/2022 | Zhou | H04W 24/10 |
| 2022/0295426 A1* | 9/2022 | Ko | H04W 56/001 |

OTHER PUBLICATIONS

"3GPP TS 38.213 V15.7.0", 3rd Generation Partnership Project; Technical Specification Group Radio Access Network; NR; Physical layer procedures for control (Release 15), Sep. 2019, pp. 1-108.
Van De Beek, Jan-Jaap, et al., "ML Estimation of Time and Frequency Offset in OFDM Systems", IEEE Transactions on Signal Processing, vol. 45, No. 7, Jul. 1997, pp. 1800-1805.

* cited by examiner

SIGNAL BLOCK RECEPTION WITH AUTOMATIC GAIN CONTROL ADJUSTMENT

TECHNICAL FIELD

The present disclosure relates generally to the field of wireless communication. More particularly, it relates to automatic gain control (AGC) for signal block reception.

BACKGROUND

Generally, the concept of automatic gain control (AGC) is well known in the art, as well as various implementation approaches therefor.

For example, US 2008/0130770 A1 describes a method for acquisition in wireless communication systems, wherein a base station transmits a preamble periodically in each superframe. The preamble includes at least one first orthogonal frequency division multiplex (OFDM) symbol for control information followed by at least one second OFDM symbol for paging information. A terminal receives the first and second OFDM symbols and determines a receiver gain based on the received power of the first OFDM symbol(s), e.g., with an AGC loop having a shorter time constant than the duration of the first OFDM symbol(s). The terminal processes the second OFDM symbol(s) based on the receiver gain to obtain the paging information.

The above approach may not be applicable and/or power efficient in all scenarios. Therefore, there is a need for alternative approaches to automatic gain control. Preferably, such alternative approaches are applicable in one or more relevant scenario and/or provide improved power efficiency (e.g., decreased power consumption).

SUMMARY

It should be emphasized that the term "comprises/comprising" (replaceable by "includes/including") when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Generally, when an arrangement is referred to herein, it is to be understood as a physical product; e.g., an apparatus. The physical product may comprise one or more parts, such as controlling circuitry in the form of one or more controllers, one or more processors, or the like.

It is an object of some embodiments to solve or mitigate, alleviate, or eliminate at least some of the above or other disadvantages.

A first aspect is a method of signal block reception with automatic gain control (AGC) for a receiver, wherein the receiver is configured for at least a sleep mode and an active mode. The signal blocks are non-adjacent in time, and each signal block is configured to be received in entirety using a valid AGC setting determined based on a previous signal block.

The method comprises (when switching from the sleep mode to the active mode for continuous reception of a signal block) receiving a first set of samples of the signal block, determining an applicable AGC setting based on the first set of samples of the signal block, and receiving a second set of samples of the signal block using the applicable AGC setting determined based on the first set of samples.

In some embodiments, the first set of samples is not purposed for AGC setting determination.

In some embodiments, the method further comprises using an initial AGC setting for receiving the first set of samples of the signal block.

In some embodiments, the initial AGC setting is one of a most recently used previous AGC setting, a most recently used previous AGC setting with reduced gain, an average of one or more previous AGC settings, and a worst-case AGC setting.

In some embodiments, the method further comprises determining a signal quality metric associated with the applicable AGC setting.

In some embodiments, the method further comprises applying the method for a subsequent signal block when the signal quality metric fulfills an application criterion.

In some embodiments, the method further comprises selecting a first size of the first set of samples for a subsequent signal block when the signal quality metric fulfills a first size criterion, and selecting a second size of the first set of samples for a subsequent signal block when the signal quality metric fulfills a second size criterion.

In some embodiments, the method further comprises applying a first AGC headroom for the applicable AGC setting when the signal quality metric fulfills a first headroom criterion, and applying a second AGC headroom for the applicable AGC setting when the signal quality metric fulfills a second headroom criterion.

In some embodiments, receiving the second set of samples of the signal block using the applicable AGC setting comprises determining an updated applicable AGC setting based on a first part of the second set of samples of the signal block, and receiving a second part of the second set of samples of the signal block using the updated applicable AGC setting.

In some embodiments, the signal block is a synchronization signal block (SSB).

In some embodiments, the first set of samples of the signal block is a primary synchronization signal (PSS) or a first portion of the (PSS).

In some embodiments, the method further comprises processing the second set of samples by performing one or more of time-frequency synchronization, secondary synchronization signal (SSS) detection, secondary synchronization signal (SSS) measurements, and physical broadcast channel (PBCH) decoding.

In some embodiments, the method further comprises (before receiving the second set of samples of the signal block using the applicable AGC setting determined based on the first set of samples of the signal block) one or more of determining that the applicable AGC setting determined based on the first set of samples meets an AGC accuracy criterion, and determining that the second set of samples is sufficient for performing one or more tasks (wherein the one or more tasks are adapted to be performed based on both the first and second sets of samples).

A second aspect is a computer program product comprising a non-transitory computer readable medium, having thereon a computer program comprising program instructions. The computer program is loadable into a data processing unit and configured to cause execution of the method according to the first aspect when the computer program is run by the data processing unit.

A third aspect is an apparatus for signal block reception with automatic gain control (AGC) for a receiver, wherein the receiver is configured for at least a sleep mode and an active mode. The signal blocks are non-adjacent in time, and each signal block is configured to be received in entirety using a valid AGC setting determined based on a previous signal block.

The apparatus comprises controlling circuitry configured to cause (responsive to switching from the sleep mode to the active mode for continuous reception of a signal block) reception of a first set of samples of the signal block, determination of an applicable AGC setting based on the first set of samples of the signal block, and reception of a second set of samples of the signal block using the applicable AGC setting determined based on the first set of samples.

A fourth aspect is a receiver comprising the apparatus of the third aspect.

A fifth aspect is a wireless communication device comprising the apparatus of the third aspect or the receiver of the fourth aspect.

In some embodiments, any of the above aspects may additionally have features identical with or corresponding to any of the various features as explained above for any of the other aspects.

Various embodiments may be particularly suitable for Third Generation Partnership Project (3GPP) standards. For example, standards according to which synchronization signal blocks (SSB:s) are transmitted by a network node at some time interval, possibly with quasi-colocation between SSB and paging occasion (PO). Examples may be found in 3GPP Technical Specifications TS 38.211 v15.7.0 and TS 38.213 v15.7.0.

An advantage of some embodiments is that alternative AGC approaches are provided.

Another advantage of some embodiments is that improved power efficiency (e.g., decreased power consumption) may be enabled. Improved power efficiency may result in increased battery time.

Generally, when power is referred to herein (e.g., in context of power efficiency and/or power consumption), it should be understood that the reference may be equally applicable for energy.

Yet an advantage of some embodiments is that AGC approaches are provided which are particularly suitable in scenarios with quasi co-location (QCL) of synchronization signal block (SSB) and paging occasion (PO).

For example, in scenarios with QCL of SSB and PO, some embodiments may decrease power consumption by allowing a receiver to postpone wakeup from a deep sleep mode in preparation for a PO until the SSB directly preceding the PO is expected.

BRIEF DESCRIPTION OF THE DRAWINGS

Further objects, features and advantages will appear from the following detailed description of embodiments, with reference being made to the accompanying drawings. The drawings are not necessarily to scale, emphasis instead being placed upon illustrating the example embodiments.

DETAILED DESCRIPTION

Figure 1:
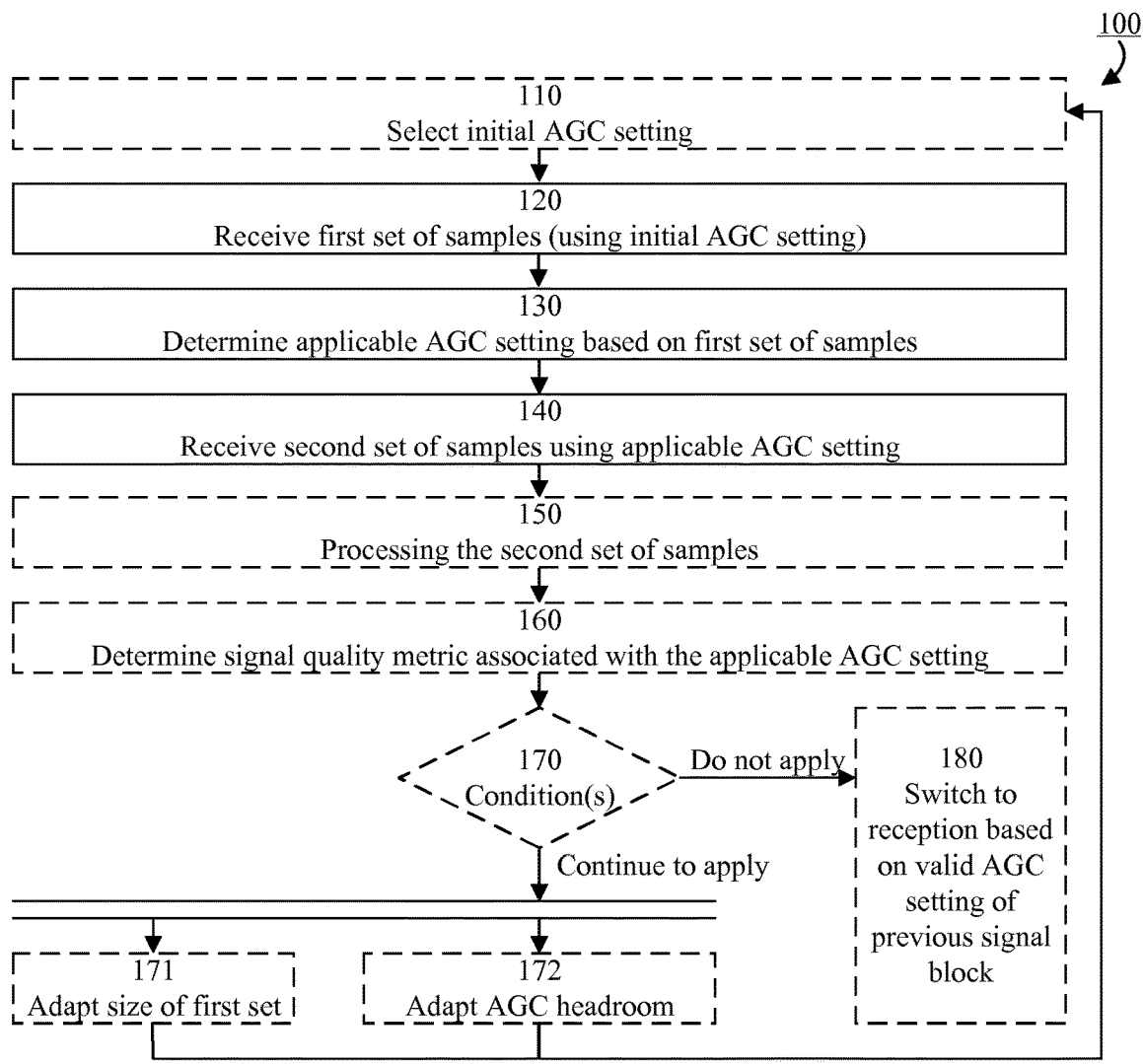
FIG. 1 is a flowchart illustrating example method steps according to some embodiments.

As already mentioned above, it should be emphasized that the term "comprises/comprising" (replaceable by "includes/including") when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Embodiments of the present disclosure will be described and exemplified more fully hereinafter with reference to the accompanying drawings. The solutions disclosed herein can, however, be realized in many different forms and should not be construed as being limited to the embodiments set forth herein.

In the following, embodiments of various approaches to automatic gain control (AGC) will be described. Particularly, some embodiments provide improved power efficiency (e.g., decreased power consumption), while maintaining acceptable AGC accuracy and/or acceptable performance for signal reception using the AGC.

Improved power efficiency is achieved by some embodiments by performing fast AGC based on a first set of samples (e.g., one or more initial symbols) of a signal block (e.g., a synchronization signal block—SSB) and using an AGC setting determined based on the first set of samples to receive a second set of samples (e.g., one or more subsequent symbols) of the same signal block.

According to some approaches, the first set of samples is not purposed for AGC setting determination. Alternatively or additionally, the first set of samples is—according to some embodiments—not normally used for determining an AGC setting to be used during the reception of the same signal block. Rather, a signal block is normally received in entirety using on an AGC setting determined based on a previous signal block; or otherwise determined based on information other than that of the first set of samples of the current signal block.

Thus, the first and second sets of samples of a signal block is, according to some approaches, either both used to determine an AGC setting to be used for reception of a subsequent signal block, or both used to perform other tasks than AGC (e.g., time-frequency synchronization, cell detection, radio resource measurements, preparations for a paging occasion, etc.).

Hence, by application of some embodiments, early wakeup (e.g., from a deep sleep mode) for performing AGC tuning on one signal block (to be used for reception of a subsequent signal block) may be avoided, or at least decreased, thereby improving power efficiency.

According to some embodiments, there are one or more trade-offs between power efficiency, AGC accuracy, and signal reception performance (e.g., performance for the tasks other than AGC). Typically, the AGC accuracy improves when more samples are included in the first set. However, including more samples in the first set may lead to that there are less samples in the second set, which may deteriorate signal reception performance. Alternatively or additionally, including more samples in the first set may lead to that there are not enough samples to perform other tasks than AGC for the signal block, and reversion may be needed to using one signal block for AGC and another signal block for tasks other than AGC, which may deteriorate power efficiency.

FIG. 1 illustrates an example method 100 according to some embodiments. The method is for a receiver (e.g., comprised or comprisable in a wireless communication device, such as a user equipment—UE) configured for at least a sleep mode and an active mode, and is a method of signal block reception with AGC.

More particularly, the method is for continuous reception of a signal block. That is, each signal block is non-interrupted in time, such that (when receiving the signal block) the receiver remains in the active mode from a start of the signal block to an end of the signal block.

The sleep mode may, for example, be a deep sleep mode. The power consumption of the receiver is typically lower in the sleep mode than in the active mode. Typically, the receiver is not able to reliably keep a suitable AGC setting while being in the sleep mode. In some embodiments, the receiver may be further configured for one or more other modes also (e.g., one or more light sleep modes having power consumption that is lower than in the active mode and higher than in the deep sleep mode and/or enabling keeping of a suitable AGC setting).

The signal blocks to be received are non-adjacent in time. Thus, between any two (first and second) signal blocks, there is a duration of time, having a non-zero length, between an end of the first signal block and a start of the second signal block. Thus, if an AGC setting to be used for reception of the second signal block was determined based on the first signal block, the receiver would typically not be able to enter the sleep mode between the first and second signal blocks, due to the risk of losing the suitable AGC setting.

Furthermore, each signal block is configured to be received in entirety using a valid AGC setting determined based on a previous signal block. Thus, the content of the signal block is typically designed to be used in entirety for other tasks than AGC and/or designed to be used in entirety for AGC as elaborated on above. In some approaches according to the prior art, reception of a signal block for performing tasks other than AGC is under the assumption that a suitable AGC setting (e.g., determined based on a previous signal block) is available at the start of the signal block. Put differently, a first set of samples of a signal block is not purposed for AGC setting determination according to some embodiments; at least not for AGC setting determination to be used for reception of a second set of samples of the same signal block.

US 2008/0130770 A1 describes using a first signal portion (F-PBCCH; Forward Primary Broadcast Control Channel) for performing AGC, and demodulating a second signal portion (F-QPCH; Forward Quick Paging Channel) based on thereon. However, if each of the first and second signal portions are interpreted as signal blocks, they are adjacent in time; and if the first and second signal portions are interpreted as comprised in a single signal block, the signal block is not configured to be received in entirety using a valid AGC setting determined based on a previous signal block. Hence, the approach of US 2008/0130770 A1 is not applicable in the scenario addressed herein.

Various embodiments, provide approaches for handling scenarios wherein an AGC setting determined based on a previous signal block is not available, or is not trusted as valid; i.e., wherein a valid AGC setting determined based on a previous signal block is not available.

The method comprises (when switching from the sleep mode to the active mode for continuous reception of a signal block) receiving a first set of samples of the signal block as illustrated by step 120, determining an applicable AGC setting based on the first set of samples of the signal block as illustrated by step 130, and receiving a second set of samples of the signal block using the applicable AGC setting determined based on the first set of samples as illustrated by step 140. In some embodiments, the applicable AGC setting is determined based only on the first set of samples.

Step 130 may comprise application of any suitable AGC approach (e.g., a fast AGC approach that provides an AGC setting before reception of the second set of samples starts).

The signal blocks may be synchronization signal blocks (SSB:s), and the first set of samples of the signal block may comprise a primary synchronization signal (PSS) or a first portion (e.g., one or more initial symbols) of the PSS.

However, the application of some embodiments is not limited to scenarios where the signal blocks are SSB:s. Contrarily, some embodiments may be equally applicable for any scenario where signal blocks to be received are non-adjacent in time (such that the receiver may go into sleep mode between signal blocks for power efficiency), and where a signal block is configured to be received in entirety using a valid AGC setting determined based on a previous signal block.

The first set of samples may comprise (e.g., consist of) a first (initial) symbol of the signal block. The second set of samples may comprise (e.g., consist of) one or more subsequent symbols of the signal block.

The first set of samples may comprise (e.g., consist of) a first and second (initial) symbols of the signal block. The second set of samples may comprise (e.g., consist of) one or more subsequent symbols of the signal block.

The first set of samples may comprise (e.g., consist of) a first half of a first symbol of the signal block. The second set of samples may comprise (e.g., consist of) a second half of the first symbol of the signal block.

In some embodiments, step 140 may comprise determining an updated (e.g., refined) applicable AGC setting based on a first part of the second set of samples of the signal block, and receiving a second part of the second set of samples of the signal block using the updated applicable AGC setting. In this way, energy efficiency may be achieved by not using a separate signal block for AGC, while AGC accuracy may be provided by using both the first set of samples and first part of the second set of samples for AGC and signal reception performance may be provided by making both first and second parts of the second set of samples available for other tasks than AGC.

As illustrated by optional step 110, an initial AGC setting may be used for receiving the first set of samples of the signal block, before the applicable AGC setting has been determined. Typically, the initial AGC setting is a non-validated (i.e., potentially, or likely, invalid) AGC setting, which cannot be trusted to be applicable for reception of the signal block.

The initial AGC setting may be based on one or more previously determined AGC settings (e.g., determined during reception of one or more previous signal blocks, after which the receiver has been in the sleep mode), and/or on one or more default AGC values. Example initial AGC settings include a most recently determined—and/or used—previous AGC setting, a worst case AGC setting (e.g., a worst case determined—and/or used—previous AGC setting), an average determined—and/or used—previous AGC setting, and a default AGC setting. In some embodiments, the initial AGC setting is biased (e.g., with reduced gain) to decrease a probability of saturating the receiver.

As illustrated by optional step 150, the method may further comprise processing the second set of samples by performing other tasks than AGC. Step 150 may, for example, comprise performing one or more of time-frequency synchronization, secondary synchronization signal (SSS) detection, SSS measurements, cell detection, radio resource measurements (RRM), physical broadcast channel (PBCH) decoding, preparations for a paging occasion. Even though not explicitly shown in FIG. 1, the method 100 may further comprise performing paging reception in a paging occasion which has quasi colocation with the signal block.

For the case when the signal block is an SSB, time-frequency synchronization may be performed based on the second set of samples using the last part of PSS when the first set of samples does not comprise the entire PSS. Alternatively or additionally, time-frequency synchronization may be performed based on the second set of samples using SSS (e.g., third symbol of the SSB) when it is assumed that the cell identity is known.

For the case when the signal block is an SSB, PBCH processing may be based on SSS (e.g., third and fourth symbols of the SSB).

In some embodiments, the method 100 further comprises determining a signal quality metric associated with the applicable AGC setting, as illustrated by optional step 160. An example of a signal quality metric is a signal-to-interference-and-noise ratio (SINR) for the second set of samples of the signal block when received using the determined applicable AGC setting.

The signal quality metric may be used for determining whether to continue application of the method 100 for one or more subsequent signal blocks, e.g., by determining whether the signal quality metric fulfills one or more application conditions. This is exemplified by optional step 170, wherein it is determined whether the signal quality metric fulfills application condition(s). Fulfillment of the application condition(s) may for example be defined as the signal quality metric falling on a first side of an application threshold (e.g., SINR being larger than a first SINR threshold value).

When it is determined that the signal quality metric does not fulfill the application condition(s)—"Do not apply" path out of step 170—the method comprises switching to operation where reception of a signal block is based on a valid AGC setting determined for a previous signal block, as illustrated by optional step 180, preventing the receiver from entering a sleep mode that does not track AGC between the two signal blocks.

When it is determined that the signal quality metric fulfills the application condition(s)—"Continue to apply" path out of step 170—the method 100 is applied also for one or more subsequent signal blocks.

Even though not shown in FIG. 1, a determination similar to that of step 170 may be performed when the receiver is in operation where reception of a signal block is based on a valid AGC setting determined for a previous signal block, to determine whether to switch to operation according to the method 100. For example, a signal quality metric (e.g., SINR) may be determined for one or more signal blocks received using a valid AGC setting determined for a previous signal block and, if this signal quality metric fulfills some condition (e.g., SINR being larger than a second SINR threshold value), a switch to apply the method 100 for one or more subsequent signal blocks may be performed.

Alternatively or additionally to performing step 170, the method may comprise occasionally (e.g., with a certain periodicity) switching to operation where reception of a signal block is based on a valid AGC setting determined for a previous signal block (compare with step 180) to verify that continued application of the method 100 is advisable based on measurements performable for such operation.

Other conditions for switching to operation where reception of a signal block is based on a valid AGC setting determined for a previous signal block (compare with step 180) include expecting, detecting, or otherwise acquiring knowledge of, a change in reception conditions (e.g., due to mobility).

In some embodiments, a determination of whether to continue application of the method 100 for the ongoing signal block reception may be performed (not illustrated in FIG. 1) before step 140. Such an approach may comprise determining to continue to step 140 when the applicable AGC setting determined based on the first set of samples meets an AGC accuracy criterion, determining to continue to step 140 when the second set of samples is sufficient for performing tasks other than AGC, or determining to continue to step 140 when the applicable AGC setting determined based on the first set of samples meets an AGC accuracy criterion and the second set of samples is sufficient for performing tasks other than AGC. When it is determined to not continue to step 140, the method may comprise switching to operation where reception of a signal block is based on a valid AGC setting determined for a previous signal block. Then a new AGC setting may be determined based on the entire signal block currently being received and used to receive the subsequent signal block for performing tasks other than AGC.

The signal quality metric determined in step 160 may, alternatively or additionally, be used for one or more other purposes. For example, the signal quality metric may be used to adapt a size of the first set, as illustrated by optional step 171. Alternatively or additionally, the signal quality metric may be used to adapt an AGC headroom, as illustrated by optional step 172.

In some embodiments, a first size of the first set of samples may be selected for a subsequent signal block when the signal quality metric fulfills a first size criterion, and a second size of the first set of samples may be selected for a subsequent signal block when the signal quality metric fulfills a second size criterion. For example, a comparatively small size may be selected for the first set of samples when SINR is greater than a third SINR threshold value, and a comparatively large size may be selected for the first set of samples otherwise.

In some embodiments, a first AGC headroom for the applicable AGC setting may be selected for a subsequent signal block when the signal quality metric fulfills a first headroom criterion, and a second AGC headroom for the applicable AGC setting may be selected for a subsequent signal block when the signal quality metric fulfills a second headroom criterion. For example, a comparatively small headroom may be selected when SINR is greater than a fourth SINR threshold value, and a comparatively large headroom may be selected otherwise.

Figure 2:
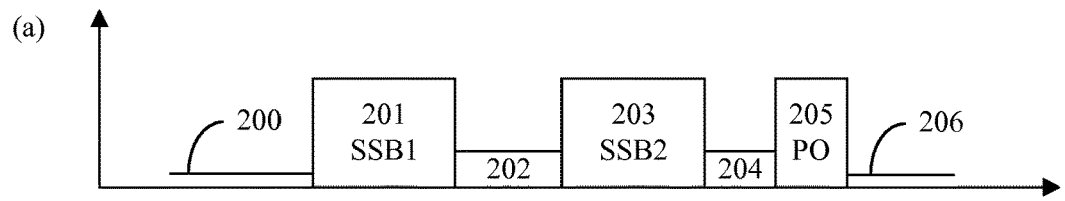
FIG. 2 is a schematic drawing illustrating example operation timings of a receiver according to some embodiments.
Figure 2:
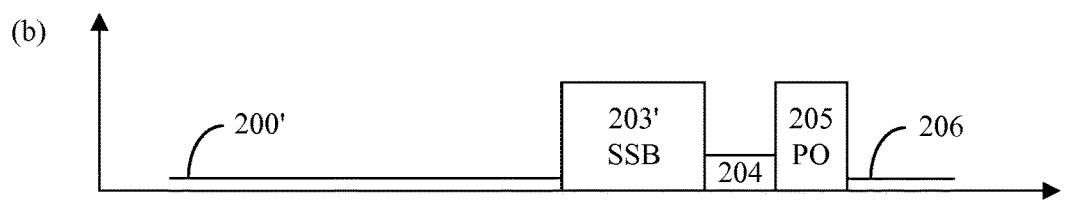

FIG. 2 schematically illustrates example operation timings of a receiver. Time is shown on the horizontal axes and power consumption is shown on the vertical axes.

In part (a), which illustrates an operation mode where reception of a signal block is based on a valid AGC setting determined for a previous signal block, the receiver is initially in a deep sleep mode 200, and wakes up into an active mode (early wake-up) to perform AGC based on a first signal block (SSB1) 201. Thereafter, the receiver cannot go back into deep sleep since it needs to keep track of the AGC so that it is valid for reception of the subsequent, second, signal block (SSB2) 203. Therefore, the receiver stays in active mode or enters a light sleep mode 202 between the first and second signal blocks. As can be seen, the light sleep mode 202 consumes more power than the deep sleep mode 200. After reception of the second signal block 203 based on the AGC setting determined based on the first signal block 201, the receiver is ready to monitor the paging occasion (PO) 205. The receiver may enter a light sleep mode 204 while awaiting the PO and a deep sleep mode 206 after the PO has passed.

In part (b), which illustrates an operation mode in accordance with some embodiments (e.g., applying the method described in connection with FIG. 1), the receiver is initially in a deep sleep mode 200', and wakes up into an active mode to perform AGC based on a first set of samples of a signal block (SSB) 203' (compare with steps 120 and 130 of FIG. 1). Thereafter, the receiver receives and processes a second set of samples of the signal block 203' (compare with steps 140 and 150 of FIG. 1) based on the AGC setting determined based on the first set of samples of a signal block 203'. Then, the receiver is ready to monitor the paging occasion (PO) 205. As for part (a) of FIG. 2, the receiver may enter a light sleep mode 204 while awaiting the PO and a deep sleep mode 206 after the PO has passed.

Hence, when applying the operation according to some embodiments, the receiver can stay in deep sleep mode much longer than otherwise as can be seen by comparing the duration of 200 and 200'. Since the early wake-up is not needed, the operation according to part (b) of FIG. 2 is more power efficient.

Figure 3:
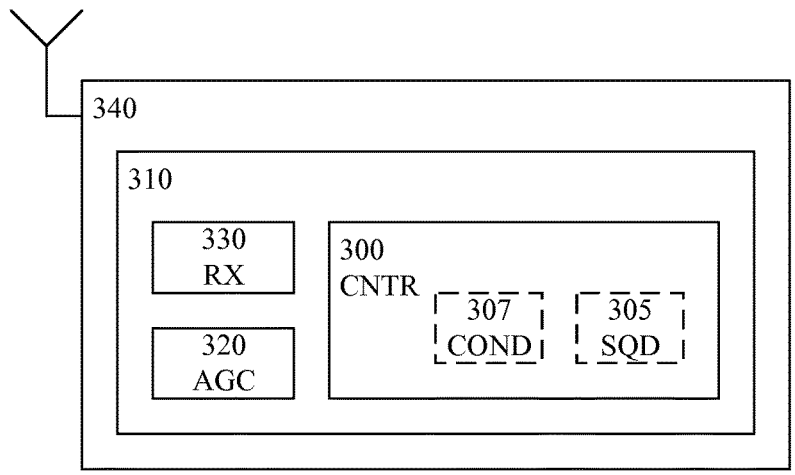
FIG. 3 is a schematic block diagram illustrating an example apparatus according to some embodiments.

FIG. 3 schematically illustrates an example apparatus 310 according to some embodiments. The apparatus 310 is for signal block reception with AGC, wherein the signal blocks are non-adjacent in time, and wherein each signal block is configured to be received in entirety using a valid AGC setting determined based on a previous signal block. The apparatus 310 is for a receiver configured for at least a sleep mode and an active mode. The apparatus 310 may be comprised or comprisable in a receiver and/or a wireless communication device 340, such as a used equipment—UE.

For example, the apparatus 310 may be configured to cause execution of (e.g., execute) one or more method steps described in connection with FIG. 1.

The apparatus comprises a controller (CNTR; e.g., controlling circuitry or a control module) 300.

The controller 300 is configured to cause—responsive to switching from the sleep mode to the active mode for continuous reception of a signal block—reception of a first set of samples of the signal block (compare with step 120 of FIG. 1), determination of an applicable AGC setting based on the first set of samples of the signal block (compare with step 130 of FIG. 1), and reception of a second set of samples of the signal block using the applicable AGC setting determined based on the first set of samples (compare with step 140 of FIG. 1).

To this end, the controller 300 is connectable, or connected, to a receiver (RX; e.g., receiving circuitry or a reception module) 330 and an automatic gain controller (AGC; e.g., automatic gain controlling circuitry or an automatic gain control module) 320.

The receiver 330 may be configured to receive the first and second sets of samples of the signal block responsive to control signaling from the controller 300 and the automatic gain controller 320 may be configured to determine the applicable AGC setting based on the first set of samples responsive to control signaling from the controller 300.

The controller 300 may be further configured to cause determination of a signal quality metric associated with the applicable AGC setting (compare with step 160 of FIG. 1). To this end the controller 300 comprises, or is otherwise associated with (e.g., connectable, or connected, to) a signal quality determiner (SQD; e.g., signal quality determining circuitry or a signal quality determination module) 305. The signal quality determiner may be configured to determine the signal quality metric associated with the applicable AGC setting.

As described in connection with FIG. 1, the signal quality metric may be used for various purposes, such as determining whether to use a single signal block or two different signal blocks for AGC setting and tasks other than AGC, selecting the size of the first set of samples, and selecting an AGC headroom.

Thus, the controller 300 may be further configured to cause determination of whether the signal quality metric fulfills one or more conditions as elaborated on, and exemplified, in connection with FIG. 1. To this end the controller 300 comprises, or is otherwise associated with (e.g., connectable, or connected, to) a condition determiner (COND; e.g., condition determining circuitry or a condition determination module) 307. The condition determiner may be configured to determine whether the signal quality metric fulfills one or more conditions.

Figure 4:
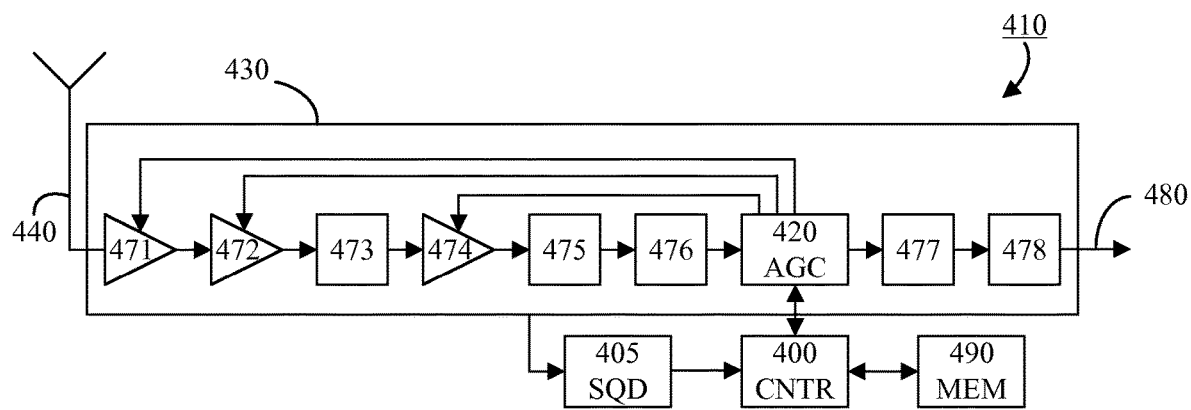
FIG. 4 is a schematic block diagram illustrating an example receiver chain of an apparatus according to some embodiments.

FIG. 4 schematically illustrates an example receiver chain 410 of an apparatus according to some embodiments. For example, the receiver chain 410 may be seen as an implementation of the apparatus 310 of FIG. 3.

The receiver chain 410 comprises a receiver path 430, a controller (CNTR) 400, a signal quality determiner (SQD) 405, and a memory (MEM) 490. The receiver path 430 comprises an AGC controller 420 and is connectable (e.g., connected) to one or more antennas 440. The receiver path also comprises a low noise amplifier (LNA) 471 configured to receive and amplify the antenna signals based on control instructions from the AGC controller 420, a down-converter 473 configured to down-convert the received signal, and first and second variable gain amplifiers 472, 474 configured to scale the received signal before and after down-conversion based on control instructions from the AGC controller 420.

The receiver path further comprises a filter 475 configured to pass relevant parts of the down-converted received signal, an analog-to-digital converter 476 configured to convert the filtered down-converted received signal to the digital domain, a digital decimator 477 configured to decimate the digital received signal, and a digital channel filter 478 configured to further filter the decimated signal before outputting it at 480.

The controller 400 is configured to cause—responsive to switching from the sleep mode to the active mode for continuous reception of a signal block—reception of a first set of samples of the signal block (compare with step 120 of FIG. 1), determination of an applicable AGC setting based on the first set of samples of the signal block (compare with step 130 of FIG. 1), and reception of a second set of samples of the signal block using the applicable AGC setting determined based on the first set of samples (compare with step 140 of FIG. 1).

The signal quality determiner 405 may be configured to determine a signal quality metric associated with the applicable AGC setting based on input from the receiver path 430, and provide the signal quality metric to the controller 400 to be used for suitable purposes as elaborated on above.

The memory 490 may, for example, be used to store previously determined AGC settings—or functions thereof—to be used as initial AGC settings, and/or a look-up table for AGC tuning.

Further exemplification associated with some embodiments will now be elaborated on in the 3GPP context of SSB reception without early AGC wakeup.

In the 3GPP concepts of New Radio (NR) and Long Term Evolution (LTE), a UE typically needs to do neighbor cell search/measurement in both active mode (e.g., RRC_CONNECTED) and idle mode (e.g., RRC_IDLE or RRC_INACTIVE) to synchronize with the network and find new cells. This typically comprises processing reference signals broadcast from the network to find timing of a detected cell, estimate UE frequency error, and decode physical-layer cell identity (cell ID) of a cell. For neighbor cell search/measurement in idle mode, a UE typically wakes up from deep sleep to perform these tasks. However, prior to the reference signal processing, the UE typically needs to tune the gain of its receiver to receive the reference signal correctly, and automatic gain control (AGC) is important to make proper use of the available ADC resolution and word lengths of signal processing functions along the receiver chain by mapping a specified range of signal levels at UE antenna connector onto the dynamic range of ADC.

In NR, the synchronization signal block (SSB) is broadcast by the network for the purpose of UE neighbor cell search/measurement. The SSB comprises synchronization signals—primary synchronization signal (PSS), secondary synchronization signal (SSS)—and physical broadcast channel (PBCH) data—PBCH demodulation reference signal (DMRS) and cell system information—packed as a single signal block. The length of the SSB may typically be four symbols, the length of the PSS may typically be one symbol, and the length of the SSS may typically be one symbol.

In NR 3GPP Release 15, SSB is not generally in line with paging occasions. That is, the SSB broadcast by the network is generally offset with regard to the "ON" duration of discontinuous reception (DRX) for paging. This means that, to be ready for a paging occasion, a NR UE may need to wake up outside the "ON" duration of DRX to perform measurements on the SSB (in particular, on its SSS component). Performing SSS measurements typically requires a proper (valid) AGC setting in the receiver. Thus—as illustrated by the example of part (a) in FIG. 2—a UE typically wakes up from deep sleep to receive a first SSB for AGC tuning, awaits a second SSB in light sleep, and uses the second SSB to perform measurements such as cell measurements in preparation for the paging occasion. This procedure leads to unnecessarily high UE power consumption, as elaborated on above.

According to some embodiments, this problem is handled by a NR UE receiving an SSB instance using fast AGC tuning performed on the same SSB instance to obviate the need for early wake-up and light sleep awaiting a second SSB.

The SSB reception may, for example, be performed using the first symbol (PSS) of the SSB for determining AGC setting with a fast-converging loop, and receiving the following three SSB symbols (SSS and PBCH) in the same SSB instance using the determined AGC setting.

When the UE is monitoring already known cells, the PSS is actually not needed to be able to perform some tasks other than AGC (e.g., time-frequency synchronization) since the SSS has known content assuming the cell is known. Thus, even if the PSS is used for AGC and is therefore not available for other tasks, time-frequency synchronization may be performed based on SSS (e.g., by applying time-domain matched filters according to multiple time/frequency offset hypotheses). Alternatively, half of the PSS symbol may be used for AGC and the other half for time-frequency synchronization. The latter may be particularly applicable for conditions where the SINR is comparatively high.

Thus, one objective may be to avoid an early UE wakeup, which is conventionally required to perform AGC tuning. This may be achieved by performing fast AGC tuning based on the first symbol (or a portion thereof) and/or the second symbol of SSB, updating the AGC parameters of the UE accordingly, and applying the updated AGC parameters to the radio frequency (RF) receiver of the UE to receive the remaining (two to three) SSB symbols.

As illustrated in FIG. 2, the default approach (part (a)) of performing AGC on a first SSB for RRM measurements of a second SSB may be replaced by an approach according to some embodiments (part (b)) wherein the AGC is performed in the same SSB as is used for the RRM measurements.

In some embodiments, the approach comprises a first step of capturing RF samples the initial symbol(s) in an SSB based on a previous AGC gain setting and performing RF power measurements on the captured signal (compare with steps 110 and 120 of FIG. 1), a second step of performing AGC based on the captured RF samples and applying these updated AGC parameters to the RF receiver (compare with step 130 of FIG. 1), a third step of capturing RF samples for the succeeding symbols in the same SSB using the updated AGC parameters (compare with step 140 of FIG. 1), a fourth step of optionally performing time-frequency synchronization using a partial PSS or using SSS (the third symbol of the SSB), and a fifth step of performing additional SSB processing based on the succeeding symbols (compare with step 150 of FIG. 1). Example processing for each of these steps will be described in the following.

In the first step, the RF receiver in a UE captures/samples the initial part of the SSB (e.g., a portion of the first symbol (PSS), the entire first symbol (PSS), the first symbol plus a portion of the second symbol (PBCH), or the first symbol plus a the entire second symbol (PBCH)). This may be done with a previously used/determined AGC setting, or a modified version thereof (e.g., biased to reduce the gain of the previous AGC setting to reduce the risk of saturating the receiver). The RF power may be measured based on sampled inphase/quadrature (I/Q) data of the intermediate frequency received signal. For example, the RF power measurement may be performed by averaging the power of the sampled data.

In the second step, the UE runs an AGC algorithm and finds the corresponding AGC gain according to the measured RF power value. The updated AGC gain is then applied to the RF receiver (e.g., by updating LNA gain). The AGC algorithm may be according to any suitable AGC approach. One example AGC algorithm uses a look-up table comprising a mapping from RF power value to AGC gain value. Such a look-up table may be generated based on UE production tests or UE field tests, and may be stored in the UE.

The AGC tuning may be performed as a single-shot AGC correction, or as several looped steps during one or two symbols. In the latter case, the AGC loop may be implemented with a time constant shorter than the duration of the one or two symbols such that the AGC converges in the duration of the first one or two symbols of the SSB. The UE can run the AGC tuning in its main receiver or using a low power receiver such as a wake-up receiver comprising an envelope detector.

In the third step, the RF receiver in the UE captures/samples the succeeding symbols of the SSB using the updated AGC gain.

In the optional fourth step, the UE may use the samples from the third step for time-frequency synchronization (e.g., when the UE wakes up for SSB reception from deep sleep without a time-frequency alignment that allows proper subsequent SSB processing).

When the UE performs AGC on only a fraction (e.g., 50%) of the PSS symbols (first symbol in SSB) and samples the other fraction (e.g., 50%) of the PSS in the third step, that other fraction of the PSS may be used for conventional time-domain time-frequency synchronization. Limiting time-frequency synchronization to a part of the PSS symbol reduces estimation performance, but sufficient quality may be achieved for comparatively high SINR values (e.g., exceeding a threshold value, which may depend on the fraction of the PSS sampled in the third step). In some embodiments, the UE may apply a trade-off between AGC accuracy and PSS-based time-frequency synchronization quality to determine how much of the PSS should be used for AGC tuning. In some embodiment, the UE may perform fast AGC on a fraction of PSS, perform initial AGC adjustment, capture the remaining portion of the PSS (e.g., for time-frequency synchronization), further refine the AGC during the second symbol (PBCH), and capture the SSS with the refined AGC setting.

Some embodiments may be particularly applicable for SSB reception on (serving and/or neighboring) cells that the UE has previously identified (i.e., the cell ID information is known to the UE). Then, the UE may use the entire PSS symbol for fast AGC and the fourth step may comprise using the SSS symbol for time-frequency synchronization. This is possible since the SSS is a function only of the cell ID. Thereby the UE has full knowledge of the frequency-domain SSS in this scenario, and can derive the corresponding time-domain sequence. A time-domain sliding correlator receiver with multiple time- and frequency-offset hypotheses may then be used to obtain time-frequency synchronization. In some embodiments, the UE may perform SSS-based synchronization also for unknown cells by expanding the hypothesis space to include the 1008 possible SSS sequences.

In some embodiments, the fourth step may comprise the UE performing frequency correction by using redundant information contained within the cyclic prefix of the sampled symbols of the third step.

In the fifth step, the UE performs additional tasks (e.g., detection and/or measurements) on SSB symbols that have been captured with the adjusted AGC settings in the third step. The additional tasks may include one or more of SSS detection (i.e., cell ID detection), link quality measurements on SSS (e.g., measurements of reference signal received power, RSRP, reference signal received quality, RSRQ, SINR, etc.), and detection of PBCH DMRS or PBCH (e.g., for the purposes of extracting master information block, MIB, content). If time-frequency synchronization was previously valid or if PSS was used for time-frequency synchronization, SSS detection may comprise decoding the SSS symbol to detect cell ID of previously unknown neighbor cells based on 336 SSS options. If time-frequency synchronization was not previously valid and PSS was to available for time-frequency synchronization, SSS detection may comprise detecting cell ID from 1008 candidates.

According to some embodiments, it may be dynamically determined whether to apply the approach of performing AGC and other tasks on the same SSB and/or how much of the SSB should be used for AGC.

For example, it may be determined to use a first portion of the first symbol (PSS) for AGC and another, second, portion of the first symbol for time-frequency synchronization when the SSB SINR of previous SSB reception occasions is sufficiently high (e.g., exceeding a threshold value) to ensure sufficient time-frequency synchronization quality based on only the second portion.

Alternatively or additionally, it may be determined whether to use one or two symbols for AGC depending on achievable and required AGC loop convergence time, and/or depending on AGC reliability or accuracy requirements, and/or depending on whether PBCH (MIB) detection is required (e.g., using only one symbol for AGC when PBCH is required).

In some embodiments, the headroom applied to the LNA gain after AGC may be adjusted based on AGC reliability (e.g., depending on the loop convergence variance with the selected measurement time and based on the SSB SINR as observed in previous activations). For example, the headroom may be comparatively large (e.g., a comparatively low gain may be applied) for comparatively short convergence time and/or comparatively high SINR.

Some embodiments may include application of any of the above principles in the context of beam-forming. For example, default operation (compare with part (a) of FIG. 2) may be used for measurements on beams other than the main beam, while the power efficient approach (compare with part (b) of FIG. 2) is used for tracking the main beam.

As mentioned before, the fast AGC tuning may be performed as a single-shot AGC correction, or as several looped steps during one or two symbols. In either case, but particularly for single-shot AGC correction, the AGC accuracy may be less accurate than required. Additional compensation of errors in the gain control characteristic may then be needed.

One possible way to achieve such additional compensation comprises gathering information about the gain control characteristic during operation, and use that information to improve the accuracy of the AGC settings. The gathered information may be in the form of measured signal level and gain setting before AGC tuning and corresponding measured signal level and gain setting after AGC tuning. Since the signal level from the antenna can be assumed to be the same for both data points (before and after AGC tuning), these data points provide information about how much the gain changes between the two gain settings.

Estimation of the gain control characteristics from such data points which provide adequate information relating to the relative gain changes may include calculating the slope of the gain characteristic for each pair of data points (i.e., for each AGC adaptation), assigning the slope value to the mean value of the gain setting for the pair, and fitting a curve targeting the gain setting mean values and corresponding slopes. The gain control characteristics could preferably be updated regularly based on data from newly performed AGC adaptations.

The gain control characteristics thus acquired may be used to compensate the AGC setting found during the fast AGC tuning. This may be achieved by determining a desired gain change based on fast AGC tuning measurements, and using the current AGC setting, the desired gain change, and the gain control characteristics to find the applicable AGC setting.

The described embodiments and their equivalents may be realized in software or hardware or a combination thereof. The embodiments may be performed by general purpose circuitry. Examples of general purpose circuitry include digital signal processors (DSP), central processing units (CPU), co-processor units, field programmable gate arrays (FPGA) and other programmable hardware. Alternatively or additionally, the embodiments may be performed by specialized circuitry, such as application specific integrated circuits (ASIC). The general purpose circuitry and/or the specialized circuitry may, for example, be associated with or comprised in an apparatus such as a wireless communication device.

Embodiments may appear within an electronic apparatus (such as a wireless communication device) comprising arrangements, circuitry, and/or logic according to any of the embodiments described herein. Alternatively or additionally, an electronic apparatus (such as a wireless communication device) may be configured to perform methods according to any of the embodiments described herein.

Figure 5:
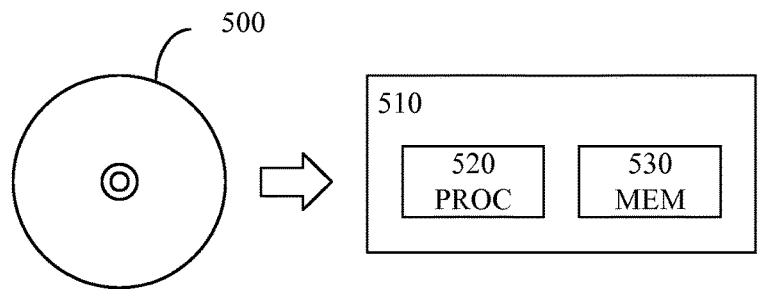
FIG. 5 is a schematic drawing illustrating an example computer readable medium according to some embodiments.

According to some embodiments, a computer program product comprises a tangible, or non-tangible, computer readable medium such as, for example a universal serial bus (USB) memory, a plug-in card, an embedded drive or a read only memory (ROM). FIG. 5 illustrates an example computer readable medium in the form of a compact disc (CD) ROM 500. The computer readable medium has stored thereon a computer program comprising program instructions. The computer program is loadable into a data processor (PROC; e.g., data processing circuitry or a data processing unit) 520, which may, for example, be comprised in a wireless communication device 510. When loaded into the data processor, the computer program may be stored in a memory (MEM) 530 associated with or comprised in the data processor. According to some embodiments, the computer program may, when loaded into and run by the data processor, cause execution of method steps according to, for example, any of the methods illustrated in FIG. 1 or otherwise described herein.

Generally, all terms used herein are to be interpreted according to their ordinary meaning in the relevant technical field, unless a different meaning is clearly given and/or is implied from the context in which it is used.

Reference has been made herein to various embodiments. However, a person skilled in the art would recognize numerous variations to the described embodiments that would still fall within the scope of the claims.

For example, the method embodiments described herein discloses example methods through steps being performed in a certain order. However, it is recognized that these sequences of events may take place in another order without departing from the scope of the claims. Furthermore, some method steps may be performed in parallel even though they have been described as being performed in sequence. Thus, the steps of any methods disclosed herein do not have to be performed in the exact order disclosed, unless a step is explicitly described as following or preceding another step and/or where it is implicit that a step must follow or precede another step.

In the same manner, it should be noted that in the description of embodiments, the partition of functional blocks into particular units is by no means intended as limiting. Contrarily, these partitions are merely examples. Functional blocks described herein as one unit may be split into two or more units. Furthermore, functional blocks described herein as being implemented as two or more units may be merged into fewer (e.g. a single) unit.

Any feature of any of the embodiments disclosed herein may be applied to any other embodiment, wherever suitable. Likewise, any advantage of any of the embodiments may apply to any other embodiments, and vice versa.

Hence, it should be understood that the details of the described embodiments are merely examples brought forward for illustrative purposes, and that all variations that fall within the scope of the claims are intended to be embraced therein.

The invention claimed is:

1. A method for a receiver apparatus configured with at least a sleep mode and an active mode, wherein the receiver apparatus is further configured to receive signal blocks that are non-adjacent and to receive each signal block in its entirety based on a valid automatic gain control (AGC) setting determined based on a previous signal block, the method comprising:
when switching from the sleep mode to the active mode for continuous reception of a signal block:
receiving a first set of samples of the signal block;
determining an applicable AGC setting based on the first set of samples of the signal block; and
receiving a second set of samples of the signal block using the applicable AGC setting determined based on the first set of samples, wherein receiving the second set of samples comprises:
determining an updated applicable AGC setting based on a first part of the second set of samples of the signal block; and
receiving a second part of the second set of samples of the signal block using the updated applicable AGC setting.

2. The method of claim 1, further comprising applying an initial AGC setting for receiving the first set of samples of the signal block, wherein the initial AGC setting is one of the following:
a most recent AGC setting;
the most recent AGC setting but with reduced gain;
an average of one or more previous AGC settings; and
a worst-case AGC setting.

3. The method of claim 1, further comprising determining a signal quality metric associated with the applicable AGC setting.

4. The method of claim 3, further comprising, when the signal quality metric fulfills an application criterion:
receiving a first set of samples of a subsequent signal block;
determining an applicable AGC setting based on the first set of samples of the subsequent signal block; and
receiving a second set of samples of the subsequent signal block using the applicable AGC setting determined based on the first set of samples.

5. The method of claim 3, further comprising:
selecting a first size of the first set of samples for a subsequent signal block when the signal quality metric fulfills a first size criterion; and
selecting a second size of the first set of samples for a subsequent signal block when the signal quality metric fulfills a second size criterion.

6. The method of claim 3, further comprising:
applying a first AGC headroom for the applicable AGC setting when the signal quality metric fulfills a first headroom criterion; and
applying a second AGC headroom for the applicable AGC setting when the signal quality metric fulfills a second headroom criterion.

7. The method of claim 1, wherein:
the signal block is a synchronization signal block (SSB); and
the first set of samples of the signal block is a primary synchronization signal (PSS) or a first portion of the PSS.

8. The method of claim 7, further comprising processing the second set of samples by performing one or more of:
time-frequency synchronization;
secondary synchronization signal (SSS) detection;
SSS measurements; and
physical broadcast channel (PBCH) decoding.

9. The method of claim 1, further comprising-before receiving the second set of samples of the signal block using the applicable AGC setting determined based on the first set of samples of the signal block-one or more of:
determining that the applicable AGC setting determined based on the first set of samples meets an AGC accuracy criterion; and
determining that the second set of samples is sufficient for performing one or more tasks, wherein the one or more tasks are adapted to be performed based on both the first and second sets of samples.

10. A receiver apparatus configured with at least a sleep mode and an active mode, wherein the receiver apparatus comprises:
receiver circuitry configured to receive signal blocks that are non-adjacent and to receive each signal block in its entirety based on a valid automatic gain control (AGC) setting determined based on a previous signal block;
controller circuitry operably coupled to the receiver circuitry, whereby the controller circuitry and the receiver circuitry are configured to, responsive to switching from the sleep mode to the active mode for continuous reception of a signal block:
receive a first set of samples of the signal block;
determine an applicable AGC setting based on the first set of samples of the signal block; and
receive a second set of samples of the signal block, by the receiver, using the applicable AGC setting determined based on the first set of samples, wherein the controller circuitry and the receiver circuitry are configured to receive the second set of samples based on:
determining an updated applicable AGC setting based on a first part of the second set of samples of the signal block; and
receiving a second part of the second set of samples of the signal block using the updated applicable AGC setting.

11. The receiver apparatus of claim 10, wherein the controller circuitry and the receiver circuitry are further configured to apply an initial AGC setting to receive the first set of samples of the signal block, and wherein the initial AGC setting is one of the following:
a most recent AGC setting;
the most recent AGC setting but with reduced gain;
an average of one or more previous AGC settings; and
a worst-case AGC setting.

12. The receiver apparatus of claim 10, wherein the controller circuitry and the receiver circuitry are further configured to determine a signal quality metric associated with the applicable AGC setting.

13. The receiver apparatus of claim 12, wherein the controller circuitry and the receiver circuitry are further configured to, when the signal quality metric fulfills an application criterion:
receive a first set of samples of a subsequent signal block;
determine an applicable AGC setting based on the first set of samples of the subsequent signal block; and
receive a second set of samples of the subsequent signal block using the applicable AGC setting determined based on the first set of samples.

14. The receiver apparatus of claim 12, wherein the controller circuitry and the receiver circuitry are further configured to:
select a first size of the first set of samples for a subsequent signal block when the signal quality metric fulfills a first size criterion; and
select a second size of the first set of samples for a subsequent signal block when the signal quality metric fulfills a second size criterion.

15. The receiver apparatus of claim 12, wherein the controller circuitry and the receiver circuitry are further configured to:
apply a first AGC headroom for the applicable AGC setting when the signal quality metric fulfills a first headroom criterion; and
apply a second AGC headroom for the applicable AGC setting when the signal quality metric fulfills a second headroom criterion.

16. The receiver apparatus of claim 10, wherein:
the signal block is a synchronization signal block (SSB); and
the first set of samples of the signal block is a primary synchronization signal (PSS) or a first portion of the PSS.

17. The receiver apparatus of claim 16, wherein the controller circuitry and the receiver circuitry are further configured to process the second set of samples based on one or more of the following operations:
time-frequency synchronization;
secondary synchronization signal (SSS) detection;
SSS measurements; and
physical broadcast channel (PBCH) decoding.

18. The receiver apparatus of claim 10, wherein the controlling circuitry is further configured to cause-before reception of the second set of samples of the signal block using the applicable AGC setting determined based on the first set of samples of the signal block-one or more of:
determination of that the applicable AGC setting determined based on the first set of samples meets an AGC accuracy criterion; and
determination of that the second set of samples is sufficient for performing one or more tasks, wherein the one or more tasks are adapted to be performed based on both the first and second sets of samples.

* * * * *